United States Patent
Reznicek et al.

(10) Patent No.: US 11,552,243 B2
(45) Date of Patent: Jan. 10, 2023

(54) MRAM STRUCTURE WITH TERNARY WEIGHT STORAGE

(71) Applicant: International Business Machines Corporation, Armonk, NY (US)

(72) Inventors: Alexander Reznicek, Troy, NY (US); Bahman Hekmatshoartabari, White Plains, NY (US); Michael Rizzolo, Delmar, NY (US); Ravi Nair, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 16/857,928

(22) Filed: Apr. 24, 2020

(65) Prior Publication Data
US 2021/0336128 A1  Oct. 28, 2021

(51) Int. Cl.
| | |
|---|---|
| *H01L 43/08* | (2006.01) |
| *H01L 43/02* | (2006.01) |
| *G11C 11/16* | (2006.01) |
| *H01L 27/22* | (2006.01) |
| *H01L 43/12* | (2006.01) |

(52) U.S. Cl.
CPC ............ *H01L 43/08* (2013.01); *G11C 11/161* (2013.01); *H01L 27/222* (2013.01); *H01L 43/02* (2013.01); *H01L 43/12* (2013.01)

(58) Field of Classification Search
CPC ....... H01L 43/08; H01L 27/222; H01L 43/02; G11C 11/161
See application file for complete search history.

(56) References Cited

U.S. PATENT DOCUMENTS

| | | | |
|---|---|---|---|
| 6,911,710 | B2 | 6/2005 | Nickel et al. |
| 6,940,748 | B2 | 9/2005 | Nejad et al. |
| 7,239,545 | B2 | 7/2007 | Hosotani |
| 8,331,141 | B2 | 12/2012 | Shukh |
| 8,553,450 | B2 | 10/2013 | Hosotani et al. |
| 8,804,410 | B2 | 8/2014 | Oh et al. |

(Continued)

FOREIGN PATENT DOCUMENTS

| | | |
|---|---|---|
| CN | 109065706 A | 12/2018 |
| WO | 2014031442 A1 | 2/2014 |

OTHER PUBLICATIONS

International Search Report dated Jun. 24, 2021, received in a corresponding foreign application, 10 pages.

(Continued)

*Primary Examiner* — Shih Tsun A Chou
(74) *Attorney, Agent, or Firm* — Scully, Scott, Murphy & Presser, P.C.; L. Jeffrey Kelly, Esq.

(57) ABSTRACT

A memory device is provided that includes at least one MTJ pillar which can have a ternary program state as compared to a binary program state in a conventional device. The MTJ pillar contains a lower MTJ structure that includes at least a first magnetic reference material, a first tunnel barrier and a first magnetic free layer material, and an upper MTJ structure that includes at least a second magnetic reference material, a second tunnel barrier and a second magnetic free layer material; the upper MTJ structure is stacked atop the lower MTJ structure. The first and second magnetic free layer materials have different designs and/or compositions resulting in different switching voltages.

17 Claims, 7 Drawing Sheets

(56) References Cited

U.S. PATENT DOCUMENTS

| | | | |
|---|---|---|---|
| 9,478,279 | B2 | 10/2016 | Ranjan et al. |
| 9,721,632 | B2 | 8/2017 | Houssameddine et al. |
| 10,050,193 | B1 | 8/2018 | Klebanov et al. |
| 2002/0036331 | A1* | 3/2002 | Nickel .................. H01F 41/307 257/421 |
| 2003/0161180 | A1 | 8/2003 | Bloomquist et al. |
| 2008/0277703 | A1 | 11/2008 | Iwayama |
| 2014/0050019 | A1 | 2/2014 | Lee et al. |
| 2014/0246742 | A1* | 9/2014 | Lee ......................... H01L 43/02 257/421 |
| 2018/0261759 | A1* | 9/2018 | Bhosale ................. H01L 43/08 |
| 2019/0165258 | A1* | 5/2019 | Peng ..................... G11C 11/161 |
| 2019/0206472 | A1* | 7/2019 | Bozdag ............... G11C 11/1675 |
| 2019/0258923 | A1 | 8/2019 | Torng et al. |
| 2019/0294584 | A1 | 9/2019 | Telesca, Jr. et al. |
| 2021/0305495 | A1* | 9/2021 | Shen ....................... H01L 43/02 |

OTHER PUBLICATIONS

Wang, N., et al., "Training Deep Neural Networks with 8-bit Floating Point Numbers", 32nd Conference on Neural Information Processing Systems (NeurIPS 2018), Dec. 2018, 11 pages, Montréal, Canada.

Zhu, C. et al., "Trained Ternary Quantization", ICLR 2017, last revised Feb. 23, 2017, 10 pages.

* cited by examiner

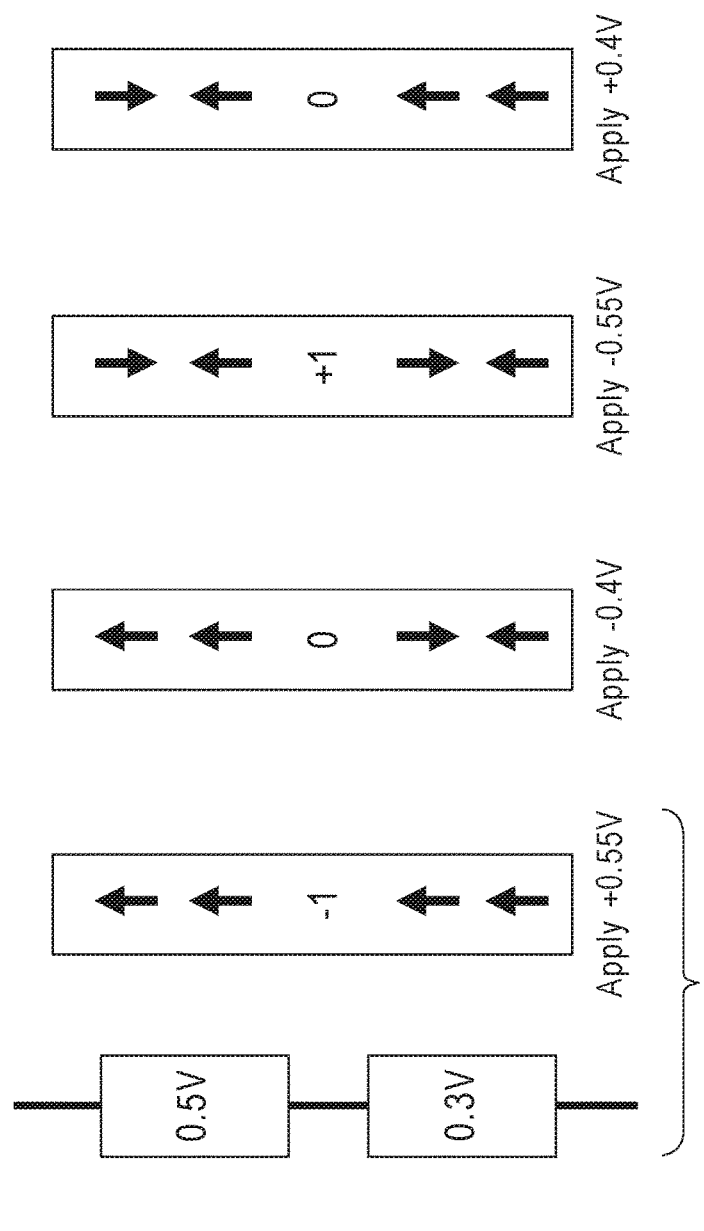
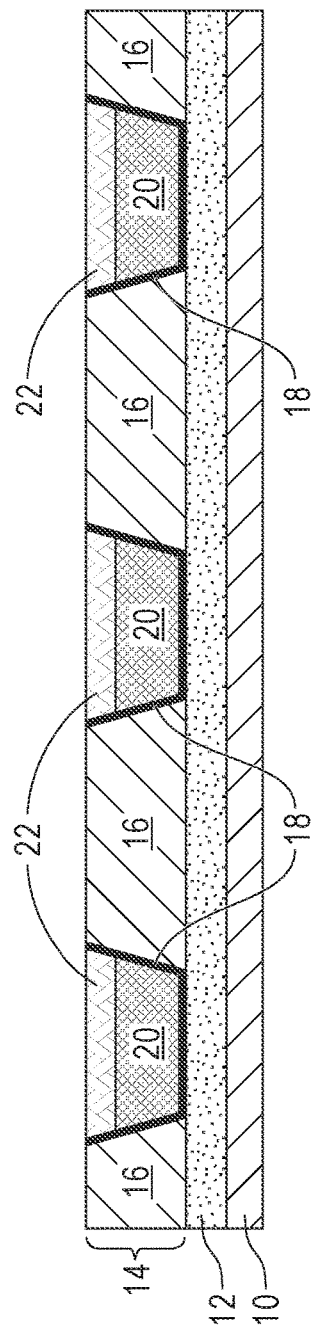

MRAM STRUCTURE WITH TERNARY WEIGHT STORAGE

BACKGROUND

The present application relates to a memory device and a method of forming the same. More particularly, the present application relates to a memory device including at least one magnetic tunnel junction (MTJ) pillar that can be used for ternary magnetoresistance random access memory (MRAM) weight storage. The memory device can be used as a component of an artificial intelligence (AI) chip.

Multiplication operations (including convolution and matrix multiplication) are the most area consuming and power consuming components in the hardware implementation of deep neural networks. Recent advances in reduced-precision optimization suggest that at least a portion of the multiplication applications can be performed at lower precision (i.e., with fewer bits) without significantly compromising the end-to-end accuracy. This provides the opportunity for power and/or area saving by employing analog devices, such as MRAM devices, for weight storage.

MRAM is a non-volatile random access memory technology in which data is stored in magnetic storage elements. These elements are typically formed from two ferromagnetic plates, each of which can hold a magnetization, separated by a thin dielectric layer (i.e., a tunnel barrier). One of the two plates is a permanent magnetic layer set to a particular polarity (i.e., a magnetic reference layer); the other plate's magnetization can be changed to match that of an external field to store memory (i.e., a magnetic free layer). Such a configuration is known as a MTJ pillar (or structure). In an integrated circuit (IC), a MTJ pillar is typically embedded within a back-end-of-the-line (BEOL) structure. Such an IC can be utilized in a hardware implementation of a deep neural network or a neuromorphic computing system.

In a mixed precision hardware implementation of a deep neural network, a suitable combination of low precision computations (e.g., convolution with highly quantized filter weights) and high precision computations (e.g., accumulation and batch normalization) can be utilized to preserve accuracy to a large degree. However, the binary program state of MRAM (e.g., −1 with spin-down, +1 with spin-up) only allows binary quantization (e.g., of filter weights) and is typically not sufficient for preserving accuracy.

SUMMARY

A memory device is provided that includes at least one MTJ pillar which can have a ternary program state as compared to a binary program state in a conventional memory device. As such, when utilized as a storage element in a memory cell, the at least one MTJ pillar of the present application can increase the number of states per cell from 2 to 3 and enhance the storage capacity of the memory array accordingly. For instance, such a memory cell can be utilized for ternary (e.g., −1, 0 and +1) weight storage in an AI chip and greatly enhance the accuracy of mixed precision computations. The MTJ pillar contains a lower MTJ structure that includes at least a first magnetic reference material, a first tunnel barrier and a first magnetic free layer material, and an upper MTJ structure that includes at least a second magnetic reference material, a second tunnel barrier and a second magnetic free layer material; the upper MTJ structure is stacked atop the lower MTJ structure. The first and second magnetic free layer materials have different designs and/or compositions resulting in different switching voltages.

One aspect of the present application relates to a memory device. In one embodiment, the memory device includes at least one MTJ pillar containing a lower MTJ structure and an upper MTJ structure that are electrically connected to each other. In accordance with the present application, the lower MTJ structure has a different switching voltage than the upper MTJ structure. In some embodiments, the MTJ pillar can be used for ternary weight storage (e.g., −1, 0 and +1). In some embodiments, the at least one MTJ pillar is a component of an AI chip.

Another aspect of the present application relates to a method of making a memory device. In one embodiment, the method includes forming a metal mask layer on a dual MTJ material stack. The metal mask layer and the dual MTJ material stack are then patterned to provide at least one metal mask capped MTJ pillar. The at least one metal mask capped MTJ pillar contains a lower MTJ structure and an upper MTJ structure that are electrically connected to each other, wherein the lower MTJ structure has a different switching voltage than the upper MTJ structure. In some embodiments, the MTJ pillar can be used for ternary weight storage (e.g., −1, 0 and +1).

BRIEF DESCRIPTION OF THE DRAWINGS

FIGS. 1A-1D are diagrams showing the different resistance states that can be formed utilizing a dual MTJ pillar in accordance with the present application.

FIG. 2 is cross sectional view of an exemplary structure that can be employed in one embodiment of the present application, the exemplary structure includes a lower interconnect level including at least one first electrically conductive structure embedded in a first interconnect dielectric material layer, wherein a bottom electrode is located on a surface of the least one electrically conductive structure.

DETAILED DESCRIPTION

Figure 3:
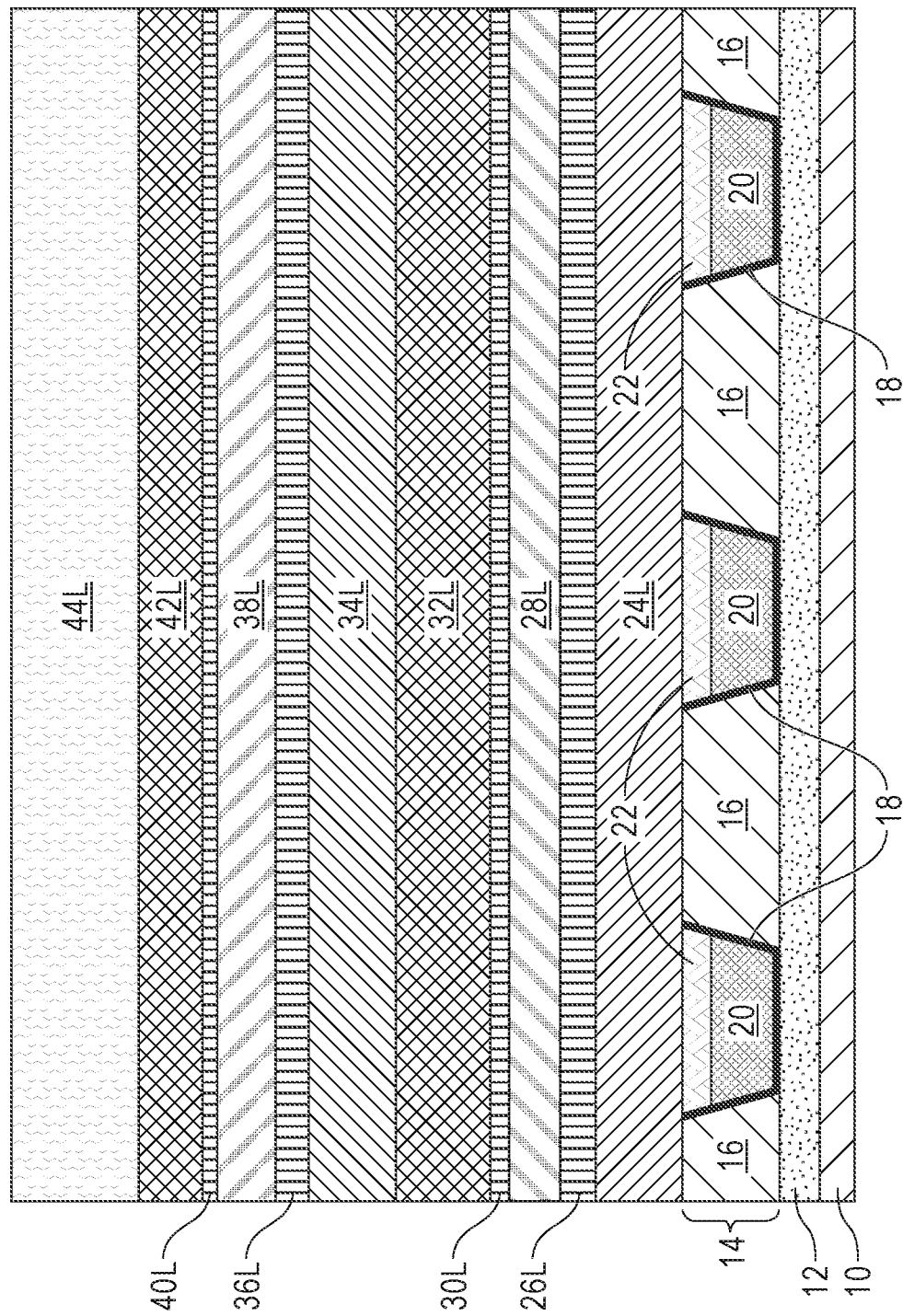
FIG. 3 is a cross sectional view of the exemplary structure of FIG. 2 after forming a dual magnetic tunnel junction (MTJ) material stack and a metal mask layer on the lower interconnect level.

The present application will now be described in greater detail by referring to the following discussion and drawings that accompany the present application. It is noted that the drawings of the present application are provided for illustrative purposes only and, as such, the drawings are not to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides a MTJ pillar that can be used to provide a memory device (i.e., MRAM device). In some embodiments, the MTJ pillar can form ternary states (e.g., −1, 0, and +1). When utilized for weight storage, the disclosed memory devices can enable AI chips which may be used for inference with essentially no loss in the predication accuracy. In one example, the weights associated with convolutional and/or fully-connected layers of a neural network are stored in memory arrays comprised of the disclosed memory devices. The disclosed embodiments of the present application enable significant area and power savings compared to conventional full-precision digital implementations due to (i) the small MRAM footprint, (ii) lower-power MRAM switching and (iii) the reduced precision requiring less hardware and operations for multiplication. Fabrication and operation of MRAM devices with additional states (e.g., quaternary) may also be contemplated.

In one embodiment of the present application, two MTJ material stacks are stacked one atop the other to provide a dual MTJ material stack. The dual MTJ material stack is then patterned to provide at least one MTJ pillar that includes a lower MTJ structure and an upper MTJ structure. Each of the MTJ structures that provide the dual MTJ material stack has a different stack structure resulting in different characteristics, especially a design leading to different switching voltages. For example, a MTJ pillar in which the lower MTJ structure of the dual MTJ material stack has a switching voltage of 0.3 volts and the upper MTJ structure of the dual MTJ material stack has a switching voltage of 0.5 volts. Given the difference characteristics of the lower and upper MTJ structures of the MTJ pillar, the two 0 states have (typically slightly) different resistance states. In typical embodiments, the two 0 states are treated as a single state; however, in some embodiments, provided sufficiently accurate sense amplifiers, the two 0 states might be treated as two different states (thus resulting in quaternary states).

FIGS. 1A-1D are diagrams showing the different resistance states that can be formed utilizing a dual MTJ pillar in accordance with the present application; in these embodiments the lower MTJ structure has a switching voltage of 0.3 volts (V), while the upper MTJ structure has a switching voltage of 0.5 volts. FIG. 1A illustrates an embodiment when an exemplary voltage of +0.55 volts is applied to the dual MTJ pillar. In the embodiment shown in FIG. 1A, the applied voltage is higher than both the switching voltages of the lower MTJ structure and the upper MTJ structure. The embodiment shown in FIG. 1A can be denoted as a low resistance state, −1.

FIG. 1C illustrates an embodiment when an exemplary voltage of −0.55 volts is applied to the dual MTJ pillar. In the embodiment shown in FIG. 1C, the applied voltage is higher than both the switching voltages of the lower MTJ structure and the upper MTJ structure. The embodiment shown in FIG. 1C can be denoted as a high resistance state, +1.

FIG. 1B illustrates an embodiment when an exemplary voltage of −0.4 volts is applied to the dual MTJ pillar. In the embodiment shown in FIG. 1B, the applied voltage is higher than the switching voltage of the lower MTJ structure, but the applied voltage is lower than the switching voltage of the upper MTJ structure. The embodiment shown in FIG. 1B can be denoted as a medium resistance state, 0.

FIG. 1D illustrates an embodiment when an exemplary voltage of +0.4 volts is applied to the dual MTJ pillar. In the embodiment shown in FIG. 1D, the applied voltage is higher than the switching voltage of the lower MTJ structure, but the applied voltage is lower than the switching voltage of the upper MTJ structure. The embodiment shown in FIG. 1B can be denoted as a medium resistance state, 0. In typical embodiments, the two 0 states are treated as a single state.

Referring now to FIG. 2, there is illustrated an exemplary structure that can be employed in one embodiment of the present application. The exemplary structure includes a lower interconnect level 14 including at least one first electrically conductive structure 20 embedded in a first interconnect dielectric material layer 16, wherein a bottom electrode 22 is located on a surface of the least one electrically conductive structure 20. Although the present application illustrates three first electrically conductive structures 20 embedded in the first interconnect dielectric material layer 16, the present application is not limited to that number of embedded first electrically conductive structures 20. Instead, the present application works when at least one electrically conductive structure is embedded in the first interconnect dielectric material layer 16. In the present application, a bottom electrode 22 is formed on a surface of each of the first electrically conductive structures 20 that are embedded in the first interconnect dielectric material layer 16.

It is noted that the drawings of the present application illustrate a memory device area in which a memory device such as, for example, a MRAM device, will be formed. A non-memory device area may be located laterally adjacent to the memory device area illustrated in the drawings of the present application. Also, while the present application illustrates a memory device that is present in the BEOL, the memory device of the present application can be formed in other locations of a chip.

As is shown, the lower interconnect level 14 can be located above a metal level 12 and a front-end-of-the-level (FEOL) 10. In some embodiments, the metal level 12 represents a middle-of-the line (MOL) level. In other embodiments, the metal level 12 represents a lower interconnect level of a multi-level interconnect structure. The metal level 12 includes electrically conductive structures (not shown) embedded in a dielectric material layer. The FEOL 10 includes a semiconductor substrate having one or more semiconductor devices (such as, for example, transistors) formed thereon. The metal level 12 and the FEOL 10 can be formed utilizing materials and techniques that are well known to those skilled in the art. So not to obscure the memory device of the present application, the materials and techniques used in providing the metal level 12 and the FEOL 10 are not described in the present application.

The first interconnect dielectric material layer 16 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The first interconnect dielectric material layer 16 can be formed utilizing a deposition process such as, for example, chemical vapor deposition (CVD), plasma enhanced chemical vapor deposition (PECVD) or spin-on coating.

The at least one first electrically conductive structure 20 is composed of an electrically conductive metal or metal alloy. Examples of electrically conductive materials that can be used in the present application include copper (Cu), aluminum (Al), cobalt (Co), or tungsten (W), while an example of an electrically conductive metal alloy is a Cu—Al alloy. The electrically conductive material that provides the at least one first electrically conductive structure 20 can be formed utilizing a deposition process such as, for example, CVD, PECVD, physical vapor deposition (PVD) sputtering or plating. As is shown in FIG. 2, the at least one first electrically conductive structure 20 has a topmost surface that is located beneath a topmost surface of the first interconnect dielectric material layer 16.

The at least one first electrically conductive structure 20 can be cylindrical in shape; although other asymmetric shapes are possible and can be used in the present application as the shape of the at least one first electrically conductive structure 20. The at least one first electrically conductive structure 20 can have a vertical sidewall or, and as shown in FIG. 2, the at least one first electrically conductive structure 20 can have a tapered sidewall.

In some embodiments, a first diffusion barrier liner 18 is formed along the sidewall and a bottom wall of the at least one first electrically conductive structure 20. In some embodiments, no first diffusion barrier liner 18 is present. The first diffusion barrier liner 18 is composed of a diffusion barrier material (i.e., a material that serves as a barrier to prevent a conductive material such as copper from diffusing through). Examples of diffusion barrier materials that can be used in providing the first diffusion barrier liner 18 include, but are not limited to, Ta, TaN, Ti, TiN, Ru, RuN, RuTa, RuTaN, W, or WN. In some embodiments, the diffusion barrier material used in providing the first diffusion barrier liner 18 can include a material stack of diffusion barrier materials. In one example, the diffusion barrier material used in providing the first diffusion barrier liner 18 can be composed of a stack of Ta/TaN. The first diffusion barrier liner 18 can be formed utilizing a deposition process including, for example, CVD, PECVD, atomic layer deposition (ALD) or PVD.

The lower interconnect level 14, including the first interconnect dielectric material layer 16, the at least one first electrically conductive structure 20, and, if present, the first diffusion barrier liner 18 can be formed utilizing conventional processes that are well-known to those skilled in the art. So not to obscure the method of the present application, the techniques used to form the lower interconnect level 14 are not provided herein. In one example, a damascene process can be used in forming the lower interconnect level 14. The damascene process includes depositing the first interconnect dielectric material layer 16, forming at least one opening (by lithography and etching) in the first interconnect dielectric material layer 16, optionally depositing a diffusion barrier material layer, depositing an electrically conductive material, and thereafter performing a planarization process to remove the electrically conductive material and, when present, the diffusion barrier material layer that is present outside of the at least one opening is formed into the first interconnect dielectric material layer 16.

As illustrated in FIG. 2, the bottom electrode 22 is located on a recessed surface of the at least one first electrically conductive structure 20. In the illustrated embodiment, and prior to forming the bottom electrode 22, an upper portion of the at least one first electrically conductive structure 20 is removed utilizing a recess etching process, and thereafter the bottom electrode 22 is formed upon the recessed surface of the at least one electrically conductive structure 20. The bottom electrode 22 is located on an entirety of the recessed topmost surface of the at least one first electrically conductive structure 20. Also, the bottom electrode 22 has a topmost surface that is coplanar with a topmost surface of the first interconnect dielectric material layer 16, and an upper portion of the first interconnect dielectric material layer 16 would be laterally adjacent the bottom electrode 22. If present, the diffusion barrier liner 18 would be located along the sidewall of both the bottom electrode 22 and the at least one first electrically conductive structure 20.

Bottom electrode 22, which is present on a surface of the at least one first electrically conductive structure 20, is composed of a conductive material such as, for example, Ta, TaN, Ti, TiN, Ru, RuN, RuTa, RuTaN, Co, CoWP, CoN, W, WN or any combination thereof. It is again noted that a bottom electrode 22 is formed on each of the first electrically conductive structures 20 that are embedded in the first interconnect dielectric material layer 16. The bottom electrode 22 can have a thickness from 2 nm to 25 nm; other thicknesses are possible and can be used in the present application as the thickness of the bottom electrode 22. The conductive material that provides the bottom electrode 22 can be formed by a deposition process such as, for example, sputtering, ALD, CVD, PECVD or PVD. An etch back process, and/or a planarization process (such as, for example, chemical mechanical polishing may follow the deposition of the conductive material that provides the bottom electrode 22.

Referring now to FIG. 3, there is illustrated the exemplary structure of FIG. 2 after forming a dual magnetic tunnel junction (MTJ) material stack (24L, 26L, 28L, 30L, 32L, 34L, 36L, 38L, 40L, and 42L) and a metal mask layer 44L on the lower interconnect level 14. The term "dual MTJ material stack" denotes a stack that contains two different MTJ material stacks, which are stacked one atop the other. In some embodiments of the present application and as illustrated in FIG. 3, the dual MTJ material stack is composed of two bottom pinned MTJ material stacks. Notably, and in the exemplary embodiment shown in FIG. 3, the dual MTJ material stack includes, from bottom to top, a first magnetic reference (or pinned) layer 24L, a first tunnel barrier layer 26L, a first magnetic free layer 28L, a first MTJ cap layer 30L, a first connecting electrode layer 32L, a second magnetic reference (or pinned) layer 34L, a second tunnel barrier layer 36L, a second magnetic free layer 38L, a second MTJ cap layer 40L, and a second connecting electrode layer 42L.

In some embodiments (not illustrated), the dual MTJ material stack is composed of two top pinned MTJ material stacks. In such an embodiment, the dual MTJ material stack includes, from bottom to top, a first magnetic free layer 28L, a first tunnel barrier layer 26L, a first magnetic reference (or pinned) layer 24L, a first MTJ cap layer 30L, a first connecting electrode layer 32L, a second magnetic free layer 38L, a second tunnel barrier layer 36L, a second magnetic reference (or pinned) layer 34L, a second MTJ cap layer 40L, and a second connecting electrode layer 42L.

In either embodiment, the first magnetic reference layer 24L and the second magnetic reference layer 34L can be composed of the same or different material (as will be defined in greater detail herein below). In accordance with the present application, the first magnetic free layer 28L and the second magnetic free layer 38L are designed to have different switching voltages. Different switching voltages can be obtained by various means including, by forming a first magnetic reference layer 24L that is compositionally different from the second magnetic reference layer 34L, by forming a first magnetic reference layer 24L that is structurally different from the second magnetic reference layer 34L, or by design differences of the resultant MTJ pillar. The structural difference may include a first magnetic reference layer 24L that has a different thickness and/or a different number of materials than the second magnetic reference layer 34L.

The various material layers of the dual MTJ material structure can be formed by utilizing one or more deposition processes such as, for example, sputtering, plasma enhanced atomic layer deposition (PEALD), PECVD or PVD.

The first magnetic reference layer 24L and the second magnetic reference layer 34L both have a fixed magnetization. The first magnetic reference layer 24L and the second magnetic reference layer 34L can be composed of a metal or metal alloy (or a stack thereof) that includes one or more metals exhibiting high spin polarization. In alternative embodiments, exemplary metals for the formation of the first magnetic reference layer 24L and the second magnetic reference layer 34L include iron, nickel, cobalt, chromium, boron, or manganese. Exemplary metal alloys may include the metals exemplified by the above. In another embodiment, the first magnetic reference layer 24L and the second magnetic reference layer 34L may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed. Again, the first magnetic reference layer 24L and the second magnetic reference layer 34L can be composed of a same material. In some embodiments however, the first magnetic reference layer 24L and the second magnetic reference layer 34L can be composed of different materials.

The first tunnel barrier layer 26L and the second tunnel barrier layer 36L are both composed of an insulator material and are both formed at such a thickness as to provide an appropriate tunneling resistance. Exemplary materials for the first tunnel barrier layer 26L and the second tunnel barrier layer 36L include magnesium oxide, aluminum oxide, and titanium oxide, or materials of higher electrical tunnel conductance, such as semiconductors or low-bandgap insulators. In some embodiments, first tunnel barrier layer 26L is composed of an insulator material that is compositionally the same as the insulator material that defines the second tunnel barrier layer 36L. In other embodiments, first tunnel barrier layer 26L is composed of an insulator material that is compositionally different than the insulator material that defines the second tunnel barrier layer 36L.

The first magnetic free layer 28L and the second magnetic free layer 38L typically have different compositions and/or structural composition resulting in different switching voltages. In some embodiments, different switching voltages can be obtained by design modifications. The first magnetic free layer 28L and the second magnetic free layer 38L can be composed of a magnetic material (or a stack of magnetic materials) with a magnetization that can be changed in orientation relative to the magnetization orientation of the first magnetic free layer 28L and the second magnetic free layer 38L. Exemplary magnetic materials for the first magnetic free layer 28L and the second magnetic free layer 38L include alloys and/or multilayers of cobalt, iron, alloys of cobalt-iron, nickel, alloys of nickel-iron, and alloys of cobalt-iron-boron.

In some embodiments, a non-magnetic metallic spacer layer can be present in first magnetic free layer 28L and/or the second magnetic free layer 38L; in such an embodiment the non-magnetic metallic spacer layer would divide the magnetic free layer into an upper magnetic free layer region and a lower magnetic free layer portion. When present, the non-magnetic metallic spacer layer is composed of a non-magnetic metal or metal alloy that allows magnetic information to be transferred therethrough and also permits the two magnetic free layer portions to couple together magnetically, so that in equilibrium the upper and lower magnetic free layer portions are always parallel. The non-magnetic metallic spacer layer allows for spin torque switching between the upper and lower magnetic free layer portions of a particular magnetic free layer.

The first MJT cap layer 30L and the second MTJ cap layer 40L can be composed of Nb, NbN, W, WN, Ta, TaN, Ti, TiN, Ru, Mo, Cr, V, Pd, Pt, Rh, Sc, Al or other high melting point metals or conductive metal nitrides. The first MJT cap layer 30L can be compositionally the same as, of compositionally different from, the second MTJ cap layer 40L. Each of the first MJT cap layer 30L and the second MTJ cap layer 40L can have a thickness from 2 nm to 25 nm; other thicknesses are possible and can be used in the present application as the thickness of the first MJT cap layer 30L and the second MTJ cap layer 40L.

The first connecting electrode layer 32L and the second connecting electrode layer 42L can be composed of one of the conductive materials mentioned above for the bottom electrode 22. The first connecting electrode layer 32L and the second connecting electrode layer 42L can be compositionally the same as each other, or they can be compositionally different from one another. In one embodiment of the present application, at least one of the first connecting electrode layer 32L and the second connecting electrode layer 42L is composed of a conductive material that is compositionally the same as the bottom electrode 22. In another embodiment of the present application, both the first connecting electrode layer 32L and the second connecting electrode layer 42L are composed of a conductive material that is compositionally the same as the bottom electrode 22. In a further another embodiment of the present application, the first connecting electrode layer 32L is composed of a conductive material that is compositionally the same as the bottom electrode 22, while the second connecting electrode 42L is composed of a conductive material that is compositionally different from the bottom electrode. In a yet further another embodiment of the present application, the first connecting electrode layer 32L is composed of a conductive material that is compositionally different from the bottom electrode 22, while the second connecting electrode 42L is composed of a conductive material that is compositionally the same as the bottom electrode 22.

The first connecting electrode layer 32L and the second connecting electrode layer 42L can be formed by a deposition process as defined above for forming the dual MTJ material stack. In some embodiments and following the deposition of the first connecting electrode layer 32L, the first connecting electrode layer can be subjected to a planarization process such as, for example, a touch up CMP. The planarization process also provides a thinned electrode that has a relatively smooth upper surface.

It is noted that in some embodiments, the dual MTJ material stack can include additional MTJ material stacks stacked atop the dual MTJ material stack shown in FIG. 2.

The metal mask layer 44L that is formed atop the dual MTJ material stack (24L, 26L, 28L, 30L, 32L, 34L, 36L, 38L, 40L, and 42L) can be composed of any metal mask material such as, for example, one of the material mentioned above for the first MJT cap layer 30L (i.e., one of Nb, NbN, W, WN, Ta, TaN, Ti, TiN, Ru, Mo, Cr, V, Pd, Pt, Rh, Sc, Al or other high melting point metals or conductive metal nitrides). The metal mask layer 44L can be formed utilizing a deposition process including, for example, PEALD, PECVD or PVD. The metal mask layer 44L can have a thickness from 10 nm to 50 nm, although other thicknesses for the metal mask layer 44L are possible can be used in the present application as the thickness of the metal mask layer 44L.

Figure 4:
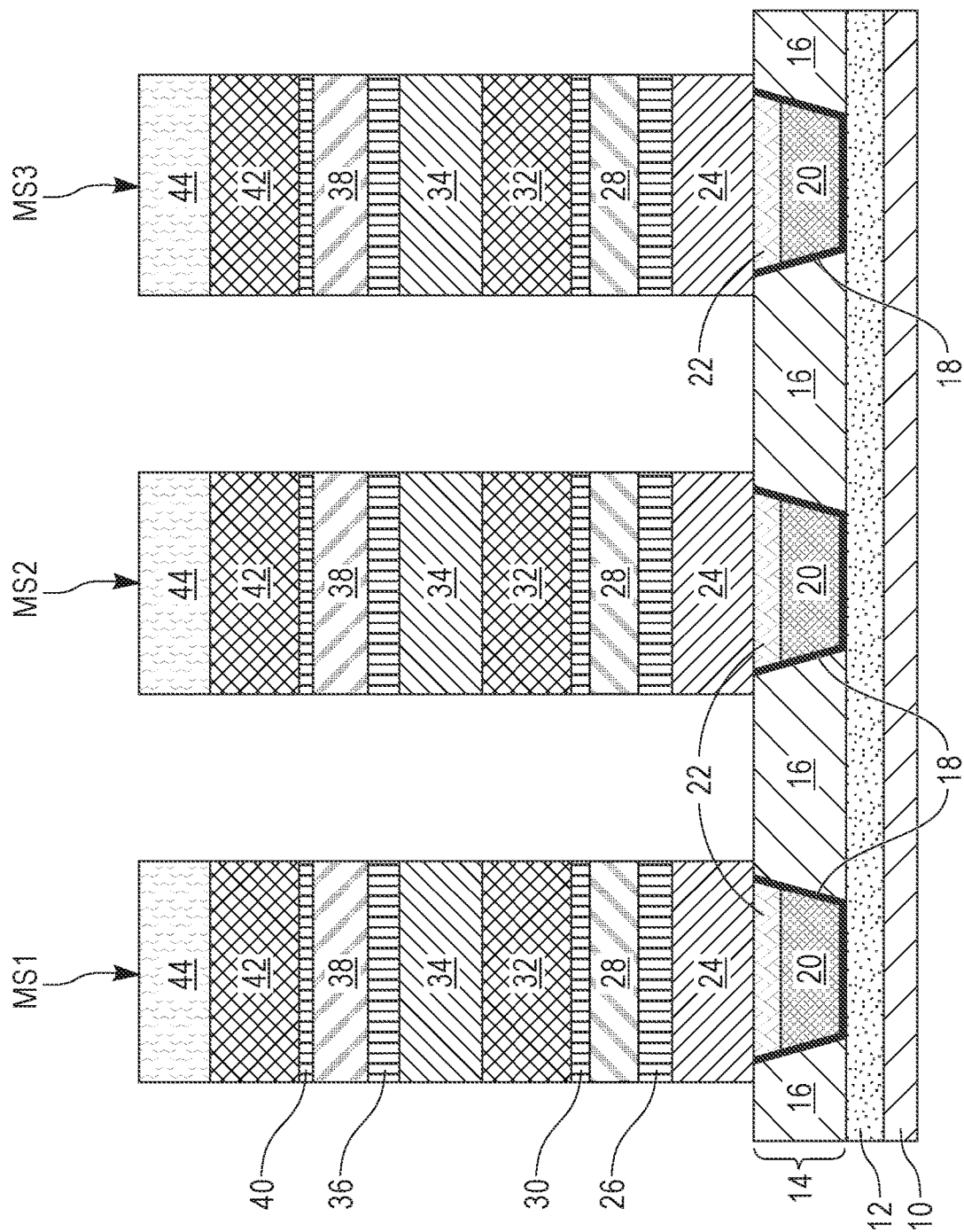
FIG. 4 is a cross sectional view of the exemplary structure of FIG. 3 after patterning the metal mask layer and the dual MTJ material stack to provide at least one metal mask capped MTJ pillar, wherein the at least one metal mask capped MTJ pillar is located on the at least one bottom electrode.

Referring now to FIG. 4, there is illustrated the exemplary structure of FIG. 3 after patterning the metal mask layer 44L and the dual MTJ material stack (24L, 26L, 28L, 30L, 32L, 34L, 36L, 38L, 40L, and 42L) to provide at least one metal mask 44 capped MTJ pillar (e.g., MS1), wherein the at least one metal mask 44 capped MTJ pillar (e.g., MS1) is located on the at least one bottom electrode 22. In FIG. 4 and by way of the specific embodiment illustrated in the present application, three metal mask 44 capped MTJ pillars (e.g., MS1, MS2 and MS3) are shown. Each metal mask 44 capped MTJ pillar is located on a surface of one of the bottom electrodes 22. In some embodiments, and as is illustrated in FIG. 4, each metal mask 44 capped MTJ pillar (e.g., MS1, MS2, and MS3) has a diameter that is greater than a diameter of the underlying bottom electrode 22. In some embodiments (not shown), each metal mask 44 capped MTJ pillar (e.g., MS1, MS2, and MS3) has a diameter that is equal to a diameter of the underlying bottom electrode 22. Diameters of each metal mask 44 capped MTJ pillar (e.g., MS1, MS2, and MS3) that are greater than or, equal to, the diameter of the underlying bottom electrode 22 reduces the chance of resputtered conductive electrode particles from depositing onto a sidewall of the MTJ pillars (MS1, MS2, and MS3).

The patterning of the metal mask layer 44L and the dual MTJ material stack (24L, 26L, 28L, 30L, 32L, 34L, 36L, 38L, 40L, and 42L) includes lithography and etching. The etching can include one or more etching processes. The one or more etching process can include an ion beam etching process. In some embodiments, the metal mask layer 44L is first patterned, and then the photoresist used in the patterning process is removed from the exemplary structure. The remaining metal mask layer (i.e., metal mask 44) serves an etch mask during the patterning of the dual MTJ material stack (24L, 26L, 28L, 30L, 32L, 34L, 36L, 38L, 40L, and 42L).

Each metal mask 44 capped MTJ pillar (e.g., MS1, MS2, and MS3) includes a non-etched portion of the metal mask layer 44L, and a non-etched portion of the dual MTJ material stack (24L, 26L, 28L, 30L, 32L, 34L, 36L, 38L, 40L, and 42L). The non-etched metal mask layer 44L can be referred to a metal mask, the non-etched portion of the dual MTJ material stack can be referred to a MTJ pillar (e.g., MS1, MS2, and MS3). In the illustrated embodiment, each MTJ pillar includes, from bottom to top, a non-etched portion of the first magnetic reference (or pinned) layer 24L (hereinafter referred to a first magnetic reference (or pinned) material 24), a non-etched portion of the first tunnel barrier layer 26L (hereinafter a first tunnel barrier 26), a non-etched portion of the first magnetic free layer 28L (i.e., a first magnetic free layer material 28), a non-etched portion of the first MTJ cap layer 30L (hereinafter first MTJ cap 30), a non-etched portion of the first connecting electrode layer 32L (hereinafter a first connect electrode 32), a non-etched portion of the second magnetic reference (or pinned) layer 34L (hereinafter a second magnetic reference (pinned) material 34), a non-etched portion of the second tunnel barrier layer 36L (hereinafter a second tunnel barrier 36), a non-etched portion of the second magnetic free layer 38L (hereinafter a second magnetic free layer material 38), a non-etched portion of the second MTJ cap layer 40L (hereinafter a second MTJ cap 40, and a non-etched portion of the second connecting electrode layer 42L (hereinafter a second connecting electrode 42).

In the present application, elements 24, 26, 28, 30, and 32 are components of a lower MTJ structure of the MTJ pillar, while elements 34, 36, 38, 40 and 42 are components of an upper MTJ structure of the MTJ pillar. The lower and upper MTJ structures are electrically connected by the first connecting electrode 32.

In some embodiments and as illustrated in FIG. 4, each of the elements (i.e., 24, 26, 28, 30, 32, 34, 36, 38, 40, and 42). within the MTJ pillar (e.g., MS1, MS2, and MS3), has a sidewall that is vertically aligned to each other as well as being vertically aligned to the sidewall of the overlying metal mask 44). Thus, the diameter of the lower MTJ structure is the same as the diameter of the upper MTJ structure. In such an embodiment, the difference in switching voltage is obtained by selecting different materials for the first magnetic free layer material and the second magnetic free layer material or by designing the first magnetic free layer material to be structurally different from the second magnetic free layer material. In some embodiments (not shown), the upper MTJ structure of the MTJ pillar has a diameter that is different from the lower MTJ structure. Such a MTJ pillar having the different diameter can have different switching voltages. For example, the upper MTJ structure has a diameter that is less than a diameter of the lower MTJ structure.

Each metal mask 44 capped MTJ pillar (e.g., MS1, MS2, and MS3) can be cylindrical in shape. Although asymmetrical shapes are possible for each metal mask 44 capped MTJ pillar (e.g., MS1, MS2, and MS3). The shape of metal mask 44 capped MTJ pillar (e.g., MS1, MS2, and MS3) typically matches that of the bottom electrode 22.

Figure 5:
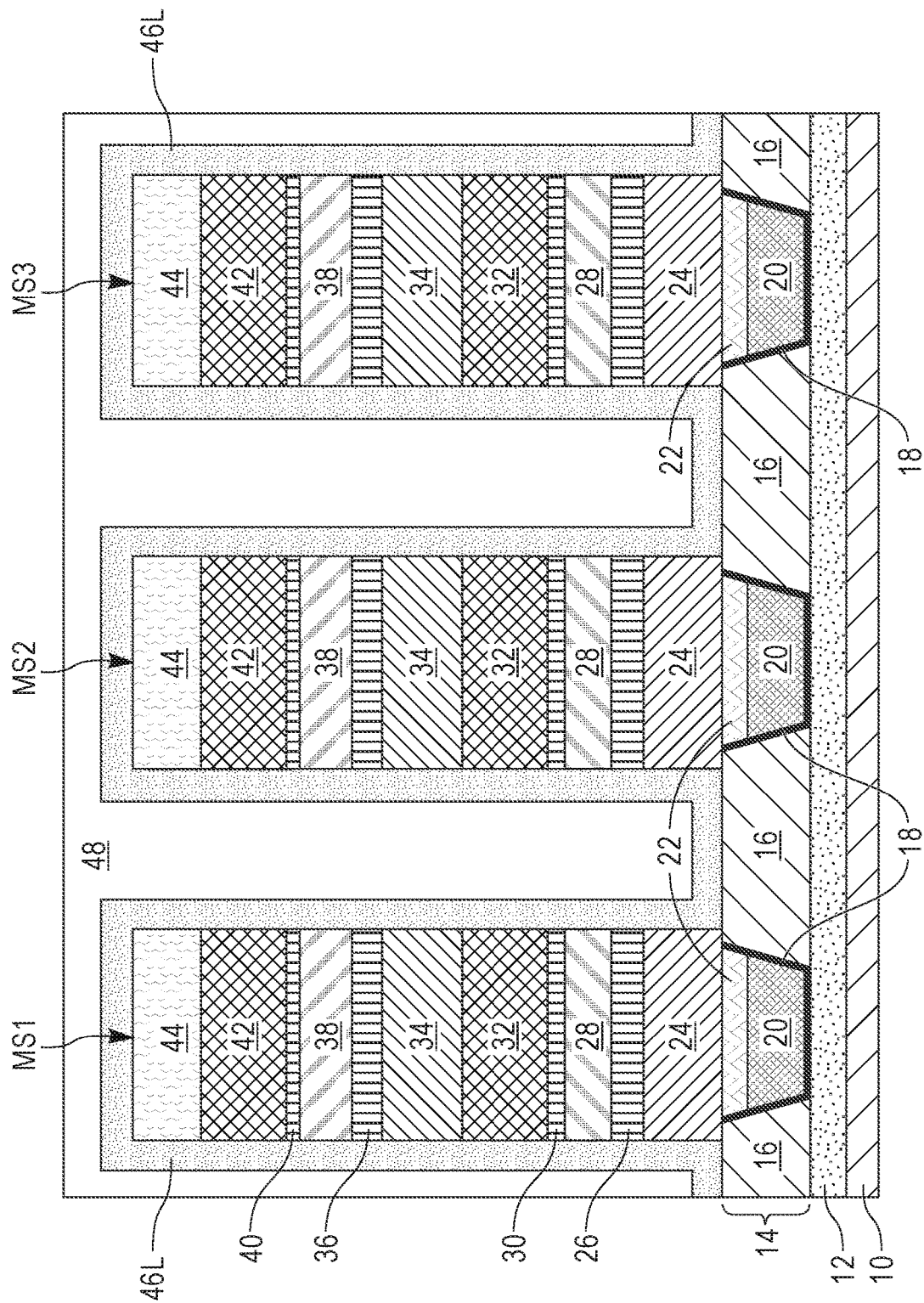
FIG. 5 is a cross sectional view of the exemplary structure of FIG. 4 after forming an encapsulation layer and an interlayer dielectric material.

Referring now to FIG. 5, there is illustrated the exemplary structure of FIG. 4 after forming an encapsulation layer 46L and an interlayer dielectric (ILD) material 48. In the present application, the encapsulation layer 46L is formed prior to forming the ILD material 48. As such, the encapsulation layer 46L is located on the sidewall of each metal mask 44 capped MTJ pillar (e.g., MS1, MS2 and MS3) and on a topmost surface of each metal mask 44.

The encapsulation layer 46L is composed of a dielectric material. In one example, the encapsulation layer 46L is composed of silicon nitride. In another example, the encapsulation layer 46L can be composed of a dielectric material that contains atoms of silicon, carbon and hydrogen. In some embodiments, and in addition to atoms of carbon and hydrogen, the dielectric material that provides the encapsulation layer 46L can include atoms of at least one of nitrogen and oxygen. In other embodiments, and in addition to atoms of silicon, nitrogen, carbon and hydrogen, the dielectric material that provides the encapsulation layer 46L can include atoms of boron. In one example, the encapsulation layer 46L can be composed of an nBLOK dielectric material that contains atoms of silicon, carbon, hydrogen, nitrogen and oxygen. In alternative example, the encapsulation layer 46L can be composed of a SiBCN dielectric material that contains atoms of silicon, boron, carbon, hydrogen, and nitrogen.

The encapsulation layer 46L can be formed utilizing a deposition process such as, for example, PECVD, PVD, or PEALD. The encapsulation layer 46L can have a thickness from 10 nm to 200 nm. Other thicknesses are possible and can be employed as the thickness of the encapsulation layer 46L. In some embodiments, the encapsulation layer 46L has a conformal thickness. The term "conformal" denotes that a material layer has a vertical thickness along horizontal surfaces that is substantially the same (i.e., within ±5%) as the lateral thickness along vertical surfaces.

The ILD material 48, which fills in the gaps located each metal mask capped MTJ pillar (e.g., MS1, MS2 and MS3) and is formed above each metal mask capped MTJ pillar, is composed of a dielectric material which is compositionally different from the encapsulation layer 46L. The ILD material 48 can include, for example, undoped silicate glass (USG), fluorosilicate glass (FSG), borophosphosilicate glass (BPSG), a spin-on low k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as the ILD material 48; the term "low-k" denotes a dielectric material having a dielectric constant of less than 4.0. In one embodiment, ILD material 48 can be formed utilizing a deposition process including, for example, CVD, PECVD, evaporation or spin-on coating.

Figure 6:
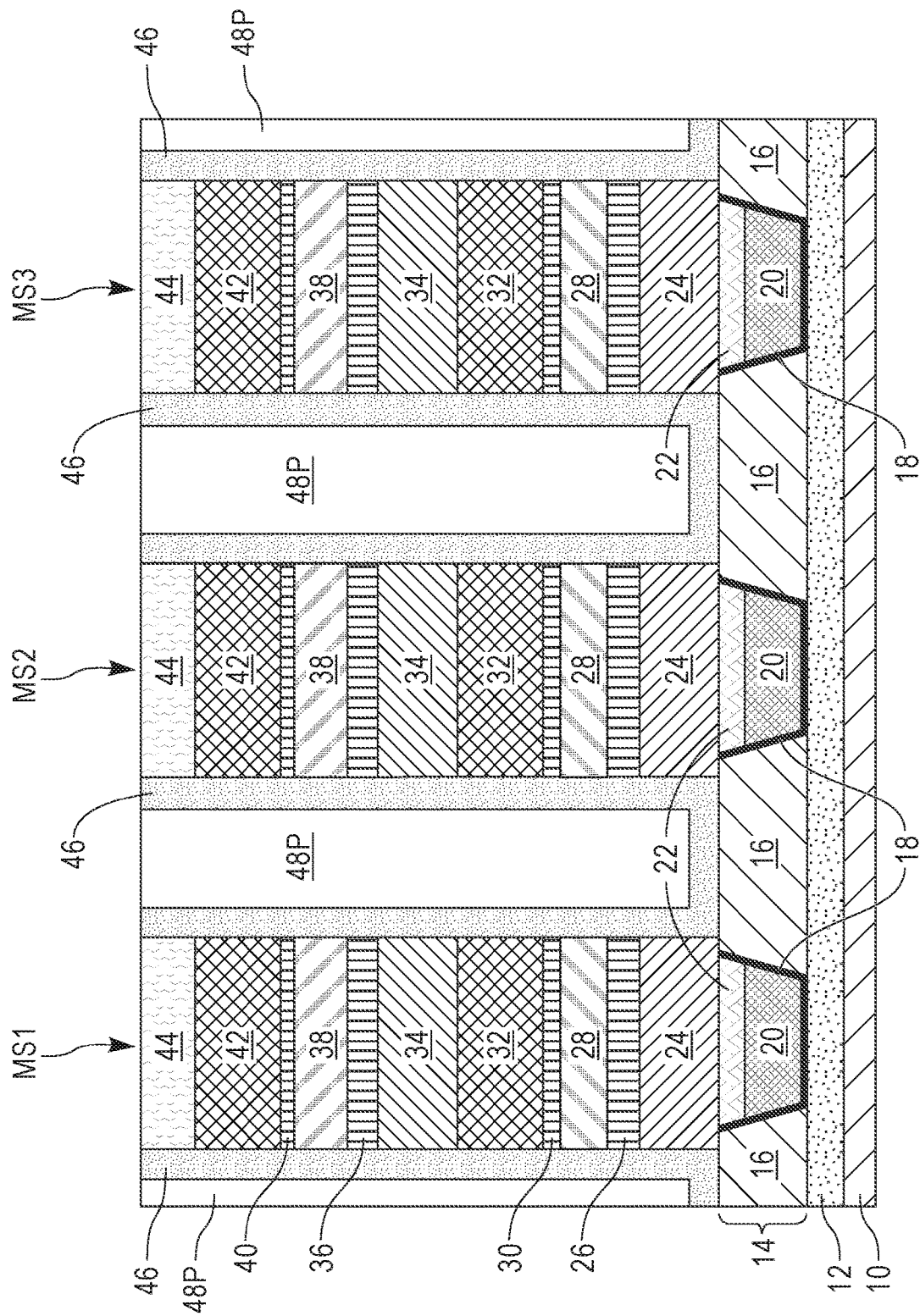
FIG. 6 is a cross sectional view of the exemplary structure of FIG. 5 after removing the interlayer dielectric material and the encapsulation layer that are located above the at least one metal mask capped MTJ pillar.

Referring now to FIG. 6, there is illustrated the exemplary structure of FIG. 5 after removing the interlayer dielectric material 48 and the encapsulation layer 46L that is located above the at least one metal mask 44 capped MTJ pillar (e.g., MS1). The removal of the interlayer dielectric material 48 and the encapsulation layer 46L that is located above the at least one metal mask 44 capped MTJ pillar (e.g., MS1, MS2, and MS3) can include a planarization process such as, for example, chemical mechanical polishing (CMP). The planarization process stop atop each metal mask 44. After removing the interlayer dielectric material 48 and the encapsulation layer 46L that is located above the at least one metal mask 44 capped MTJ pillar (e.g., MS1, MS2, and MS3), portions of the ILD material 48 and the encapsulation layer 46L remain in the gaps that are located between each metal mask capped MTJ pillar (e.g., MS1, MS2, and MS3). The portion of the remaining interlayer dielectric material 48 can be referred to herein as an ILD material structure 48P, and the portion of the remaining encapsulation layer 46L can be referred to herein as an encapsulation liner 46. The ILD material structure 48P and the encapsulation liner 46 have topmost surfaces that are coplanar with each other and coplanar with a topmost surface of each metal mask 44.

Figure 7:
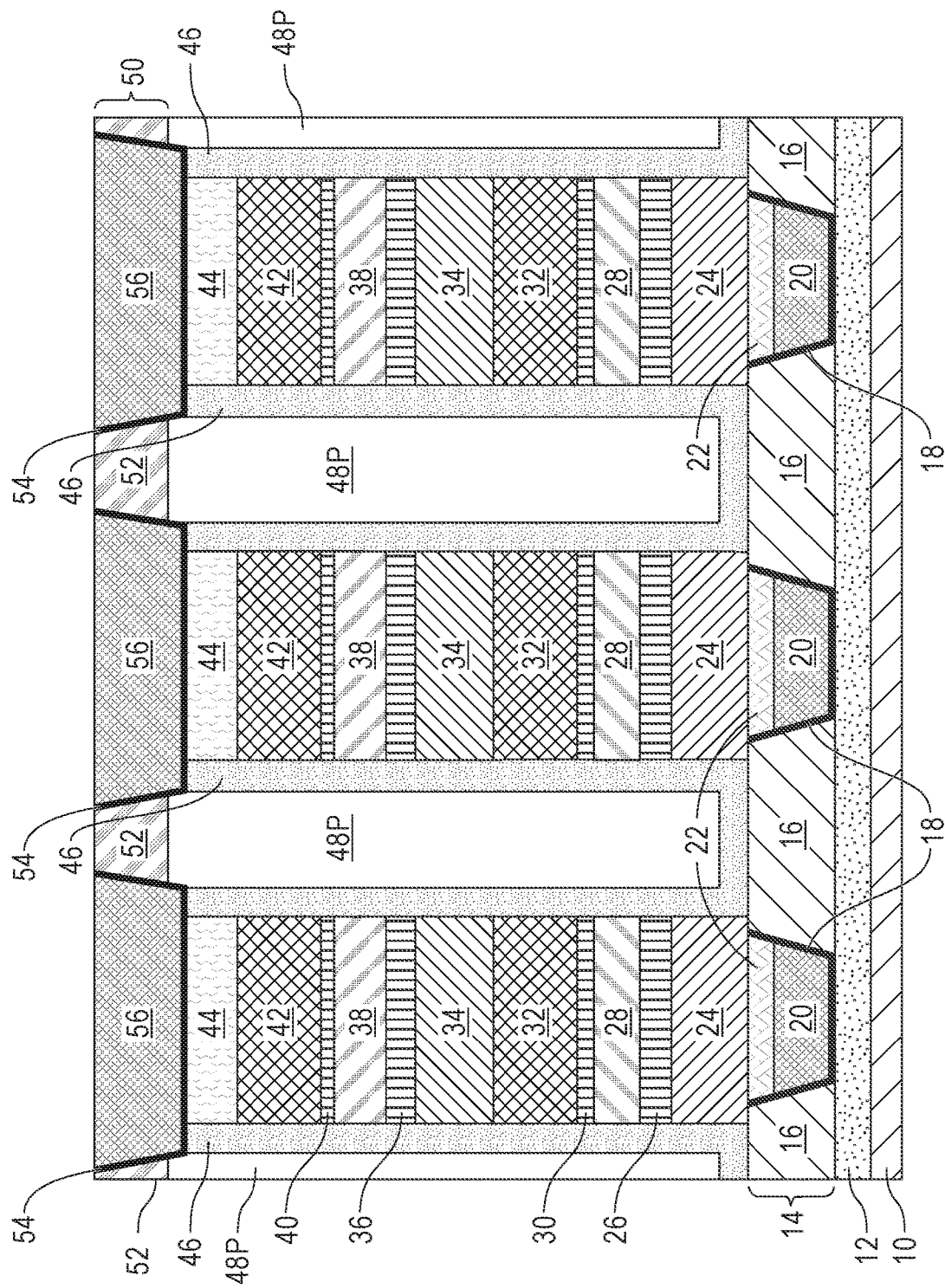
FIG. 7 is a cross sectional view of the exemplary structure of FIG. 6 after forming an upper interconnect level including at least one second electrically conductive structure embedded in a second interconnect dielectric material layer, wherein the at least one second electrically conductive structure is in contact with the at least one metal mask capped MTJ pillar.

Referring now to FIG. 7, there is illustrated the exemplary structure of FIG. 6 after forming an upper interconnect level 50 including at least one second electrically conductive structure 56 embedded in a second interconnect dielectric material layer 52, wherein the at least one second electrically conductive structure 56 is in contact with the at least one metal mask 44 capped MTJ pillar (e.g., MS1). In some embodiments, a second diffusion barrier liner 54 can be present along the sidewalls and bottom wall of the at least one second electrically conductive structure 56.

The upper interconnect level 50 can be formed utilizing techniques well known to those skilled in the art. In one embodiment, the upper interconnect level 50 can be formed utilizing a damascene process which can include depositing the second interconnect dielectric material layer 52 on the exemplary structure shown in FIG. 6. Next, at least one opening is formed into the second interconnect dielectric material layer 52 by lithography and etching. An optional diffusion barrier material layer that provides the second diffusion barrier liner 54 and a conductive material that provides the at least one second electrically conductive structure 56 are then deposition, and thereafter a planarization process such as, for example, CMP, can be used to provide the exemplary structure shown in FIG. 7.

The second dielectric material layer 52 can be composed of one of the interconnect dielectric materials mentioned above for the first interconnect dielectric material layer 16. The second dielectric material layer 52 can be compositionally the same as, or compositionally different from, the dielectric material that provides the first interconnect dielectric material layer 16. The second dielectric material layer 52 can be compositionally the same as, or compositionally different from, the dielectric material that provides the ILD material 48. The second dielectric material layer 52 can be formed utilizing one of the deposition processes mentioned above for forming the first interconnect dielectric material layer 16.

When present, the second diffusion barrier liner 54 can be composed of one of the diffusion barrier materials mentioned above for the first diffusion barrier liner 18. When present, the second diffusion barrier liner 54 can be compositionally the same as, or compositionally different from, the diffusion barrier material that provides the first diffusion barrier liner 18. The diffusion barrier material that provides the optional second diffusion barrier liner 54 can be formed utilizing one of the deposition processes mentioned above for forming the first diffusion barrier liner 18.

The at least one second electrically conductive structure 56 is composed of one of the electrically conductive metals or metal alloys mentioned above for the at least one first electrically conductive structure 20. The at least one second electrically conductive structure 56 can be compositionally the same as, or compositionally different from, the conductive material that provides the at least one first electrically conductive structure 20. The conductive material that provides the at least one second electrically conductive structure 56 can be formed utilizing one of the deposition processes mentioned above for forming the at least one first electrically conductive structure 20.

In some embodiments (as shown in FIG. 7), the at least one second electrically conductive structure 56 has a topmost surface that is coplanar with a topmost surface of the second interconnect dielectric material layer 52 and, if present, a topmost surface of the second diffusion barrier liner 54. The at least one second electrically conductive structure 56 can have a vertical sidewall or, and as shown in FIG. 7, the at least one second electrically conductive structure 56 can have a tapered sidewall.

Figure 8:
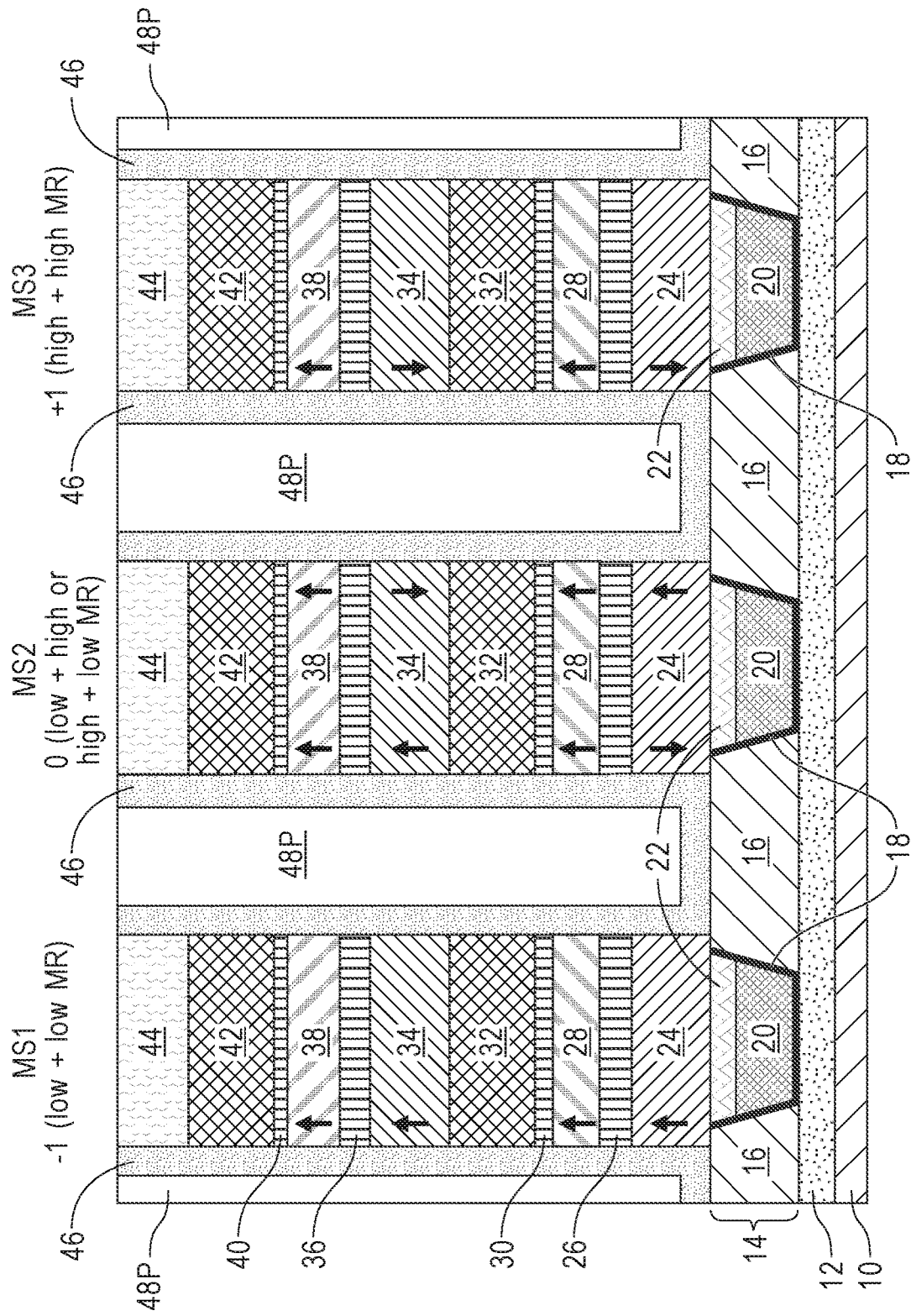
FIG. 8 is a cross sectional view of an exemplary memory device of the present application.

Referring now to FIG. 8, there is illustrated an exemplary memory device of the present application; for clarity, the upper interconnect level 50 has been omitted from the exemplary structure. Notably, FIG. 8 illustrates the three different states, −1, 0 and +1, that can be obtained utilizing a MTJ pillar that contains the lower and upper MTJ structures described above; in this embodiment the first and second magnetic free layer materials present in the MTJ pillar are compositionally different from each other. In the illustrated embodiment, MS1 is exemplified as having a −1 state (low resistance and low magnetoresistance, MR), MS2 is exemplified as having a 0 state (middle resistance, and middle MR), and MS3 is exemplified as having a +1 state (high resistance, high MR). It should be noted that a single MTJ pillar, say MS1, can exhibit all three states depending on the voltage applied thereto. Thus, each MTJ pillar containing the lower and upper MTJ structures described above can have ternary MRAM weight storage.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory device comprising:
at least one magnetic tunnel junction (MTJ) pillar containing a lower MTJ structure and an upper MTJ structure that are electrically connected to each other, wherein the lower MTJ structure has a different switching voltage from the upper MTJ structure; and
a bottom electrode located beneath the at least one MTJ pillar and in direct physical contact with a bottommost surface of the lower MTJ structure, wherein the bottom electrode is present on a recessed surface of a first electrically conductive structure, and both the bottom electrode and the first electrically conductive structure are embedded in a layer of a single interconnect dielectric material, and wherein the bottom electrode has a topmost surface that is coplanar with a topmost surface of the layer of the single interconnect dielectric material, and the first electrically conductive structure has a topmost surface that is located between the topmost surface of the layer of the single interconnect dielectric material and a bottommost surface of the layer of the single interconnect dielectric material.

2. The memory device of claim 1, wherein the MTJ pillar forms a ternary magnetoresistive random access memory (MRAM) weight storage.

3. The memory device of claim 1, wherein the lower MTJ structure and the upper MTJ structure are both bottom pinned MTJ stack structures.

4. The memory device of claim 3, wherein the lower MTJ structure comprises a first magnetic reference material, a first tunnel barrier material, a first magnetic free layer material, and a first connecting electrode, and the upper MTJ structure comprises a second magnetic reference material, a second tunnel barrier material, a second magnetic free layer material, and a second connecting electrode, wherein the first connecting electrode electrically connects the lower MTJ structure to the upper MTJ structure.

5. The memory device of claim 4, wherein the first magnetic free layer material is compositionally or structurally different from the second magnetic free layer material.

6. The memory device of claim 4, wherein the upper MTJ structure and the lower MTJ structure have a same diameter.

7. The memory device of claim 3, wherein the lower MTJ structure has a diameter that differs from a diameter of the upper MTJ structure.

8. The memory device of claim 1, wherein the lower MTJ structure and the upper MTJ structure are both top pinned MTJ stack structures.

9. The memory device of claim 8, wherein the lower MTJ structure comprises a first magnetic free layer material, a first tunnel barrier material, a first magnetic reference material, and a first connecting electrode, and the upper MTJ structure comprises a second magnetic free layer material, a second tunnel barrier material, a second magnetic reference material, and a second connecting electrode, wherein the first connecting electrode electrically connects the lower MTJ structure to the upper MTJ structure.

10. The memory device of claim 9, wherein the first magnetic free layer material is compositionally or structurally different from the second magnetic free layer material.

11. The memory device of claim 9, wherein the upper MTJ structure and the lower MTJ structure have a same diameter.

12. The memory device of claim 9, wherein the lower MTJ structure has a diameter that differs from a diameter of the upper MTJ structure.

13. The memory device of claim 1, wherein the lower MTJ structure is switched independently from the upper MTJ structure.

14. The memory device of claim 1, wherein the at least one MTJ pillar is located between the bottom electrode, and a topmost connecting electrode of the MTJ pillar.

15. The memory device of claim 14, wherein the topmost connecting electrode of the at least one MTJ pillar is connected to a second electrically conductive structure that is located above the at least one MTJ pillar.

16. The memory device of claim 1, wherein the at least one MTJ pillar has a lateral dimension that is greater than a lateral dimension of the bottom electrode and the first electrically connective structure.

17. The memory device of claim 1, wherein the topmost surface of each of the layer of the single interconnect dielectric material and the bottom electrode is entirely planar.

* * * * *